United States Patent [19]

Sellati

[11] Patent Number: 4,748,402

[45] Date of Patent: May 31, 1988

[54] CIRCUIT IDENTIFIER TESTER FOR TELECOMMUNICATION PAIRS

[76] Inventor: Valentine Sellati, 8880 N.W. 24 Terrace, Miami, Fla. 33172

[21] Appl. No.: 857,879

[22] Filed: May 1, 1986

[51] Int. Cl.[4] .......................................... G01R 31/02
[52] U.S. Cl. ...................... 324/66; 324/540; 379/10
[58] Field of Search ...................... 324/66, 51, 52, 54; 379/25, 12, 10

[56] References Cited

U.S. PATENT DOCUMENTS

| | | | |
|---|---|---|---|
| 3,742,350 | 6/1973 | White | 324/66 |
| 3,891,811 | 6/1975 | Miller | 379/25 X |
| 4,384,249 | 5/1983 | Medina | 324/51 |
| 4,445,086 | 4/1984 | Bulatao | 324/66 |

OTHER PUBLICATIONS

Hewlett Packard, Pair Identifier System Models 4960B/4961B, Nov. 1979, pp. 1 through 31.

Primary Examiner—Reinhard J. Eisenzopf
Assistant Examiner—Robert W. Mueller
Attorney, Agent, or Firm—Jesus Sanchelima

[57] ABSTRACT

A telecommunications circuit pairs identifier device that has a transmitter portion that is connected to a predetermined group of pairs at the trunk line termination point and a receiver that is plugged at each one of the jacks distributed in a given network. The transmitter continuously accesses each one of the circuit pairs by counting them and transmits, during the time of access or selection, the count for that particular jack. The receiver portion of the device is removably connectable to each jack and detects, decodes and displays the output sent so that a user can identify the pair in the jack with a particular predetermined pair termination.

3 Claims, 3 Drawing Sheets

CIRCUIT IDENTIFIER TESTER FOR TELECOMMUNICATION PAIRS

BACKGROUND OF THE INVENTION

1. Field of the Invention

The present invention relates to testers for telecommunication circuit pairs, and more particularly, to testers that identify particular pairs from among numerous pairs terminated on connectors or jacks.

2. Description of the Related Art

Telecommunication (telephone and data) circuits are usually distributed over distant physical locations, for instance, in a hospital or university there are telecommunication extensions with the circuit pairs connected on one end to jacks in different buildings and the other end terminating on a central connector block. Ordinarily, when the identification of these circuit pairs becomes necessary, two technicians have to use walkie-talkies and one of the technicians applies a signal at one end of the circuit pair that is tested for and at the other end the second technician receives the signal.

The present invention obviates this by using a transmitter device that is removably connected to the conventional connectors in a central point or main distribution terminal from where all extension jacks are connected and a receiver device is carried by one technician who goes from jack to jack identifying each circuit pair. This eliminates the need for one person at the central point and the identification is performed at electronic speed.

The closest related art, to the best of applicant's knowledge, appears to be a commercially available Pair Identifier System currently marketed by Hewlett Packard under Model Nos. 4960B/4961B. This system comprises, basically, a Pair Identifier Office Unit (4960B) and a Pair Identifier Field Unit (4961B). The latter queries the former by sending signals which are processed and sent back. However, only one Field Unit may be used simultaneously to interact with the Office Unit. Assuming that the 100 pairs limitation in the Hewlett Packard device may be lifted and it could be made to work with 5,000 pairs (a large government institution, university, hospital, etc.) it would take an enormous amount of time for one person to go through all of them. With the present invention, if desired, more than one person may use the receiver to identify pairs independently from each other.

Other patents describing the closest subject matter provide for a number of more or less complicated features that fail to solve the problem in an efficient and economical way. None of these patents suggest the novel features of the present invention.

SUMMARY OF THE INVENTION

It is one of the main objects of the present invention to provide a tester for telecommunication circuits that readily permits identification of circuit pairs by one or more persons independently of each other.

It is another object of the present invention to provide a device for identification of telecommunication circuit pairs that assigns a numerical label reference to each pair and transmits this label to a receiver connected to the jack or pair termination undergoing the test.

It is still another object of this invention to provide a tester that can automatically display the identification label of a particular pair without requiring any operational training.

It is yet another object of the present invention to provide such a device that is inexpensive to manufacture and maintain while retaining its effectiveness.

Further objects of the invention will be brought out in the following part of the specification, wherein detailed description is for the purpose of fully disclosing the invention without placing limitations thereon.

BRIEF DESCRIPTION OF THE DRAWINGS

With the above and other related objects in view, the invention consists in the details of construction and combination of parts as will be more fully understood from the following description, when read in conjunction with the accompanying drawings in which.

DETAILED DESCRIPTION OF THE PREFERRED EMBODIMENT

The present invention comprises, basically, two parts: a transmitter 10 and a receiver 100. In order to facilitate the understanding of the present invention, an embodiment capable of identifying eight telecommunication pairs is described here. But units with considerably larger capacity may be implemented using the inventive concepts disclosed and claimed herein.

Figure 1:
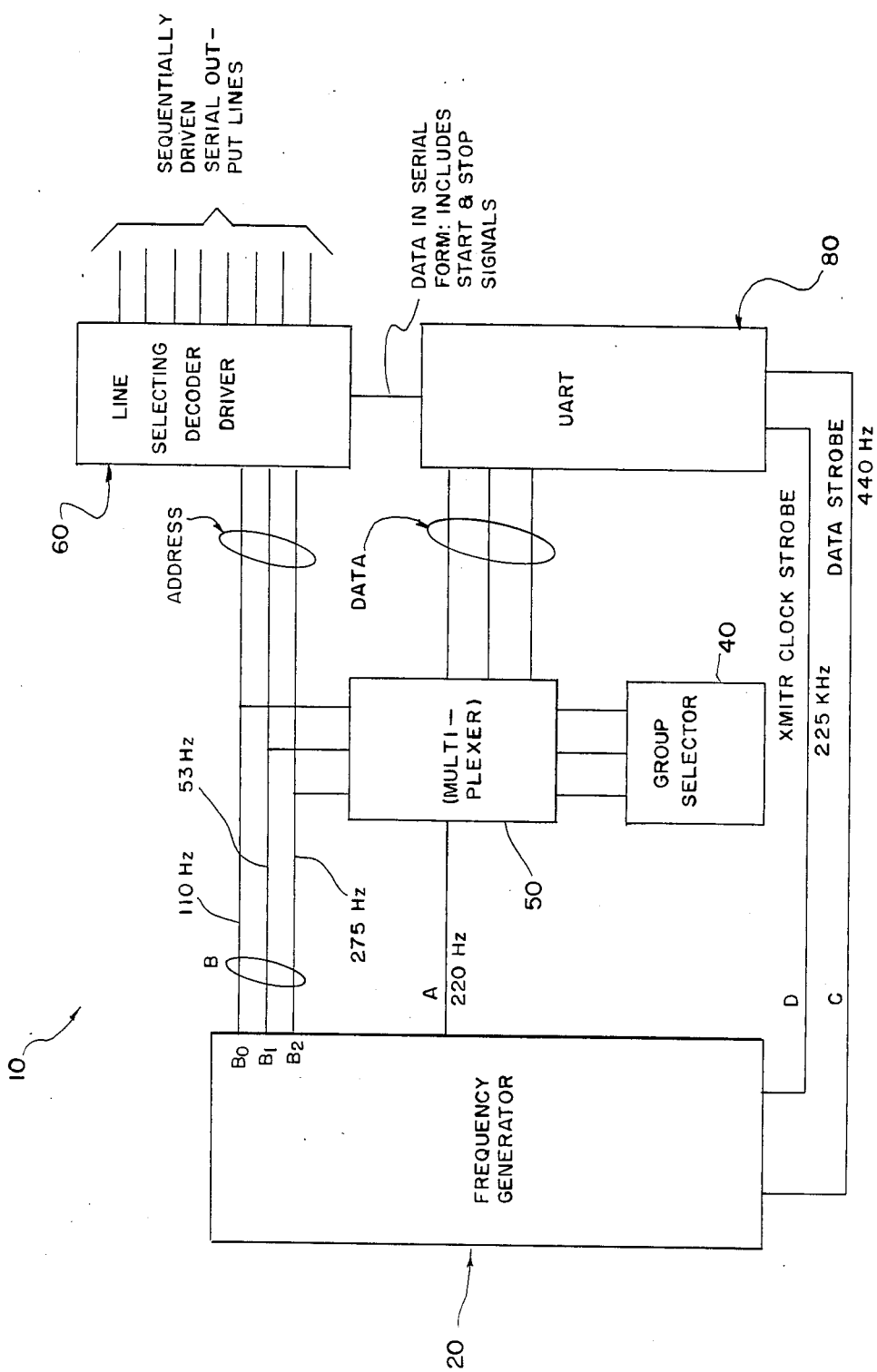
FIG. 1 represents a schematic block diagram of a simplified version of the transmitter portion of the invention.

Referring now to FIG. 1, where the transmitter portion of the present invention is generally referred to with numeral 10, it can be observed that it has a frequency generator circuit 20 that provides several signals, namely, output A which is a 220 Hertz signal, output B which is composed of signals $B_0$, $B_1$ and $B_2$, output C which is a 440 Hertz signal and output D which corresponds to the transmitter's UART clock strobe signal with 225 KHz.

Figure 2:
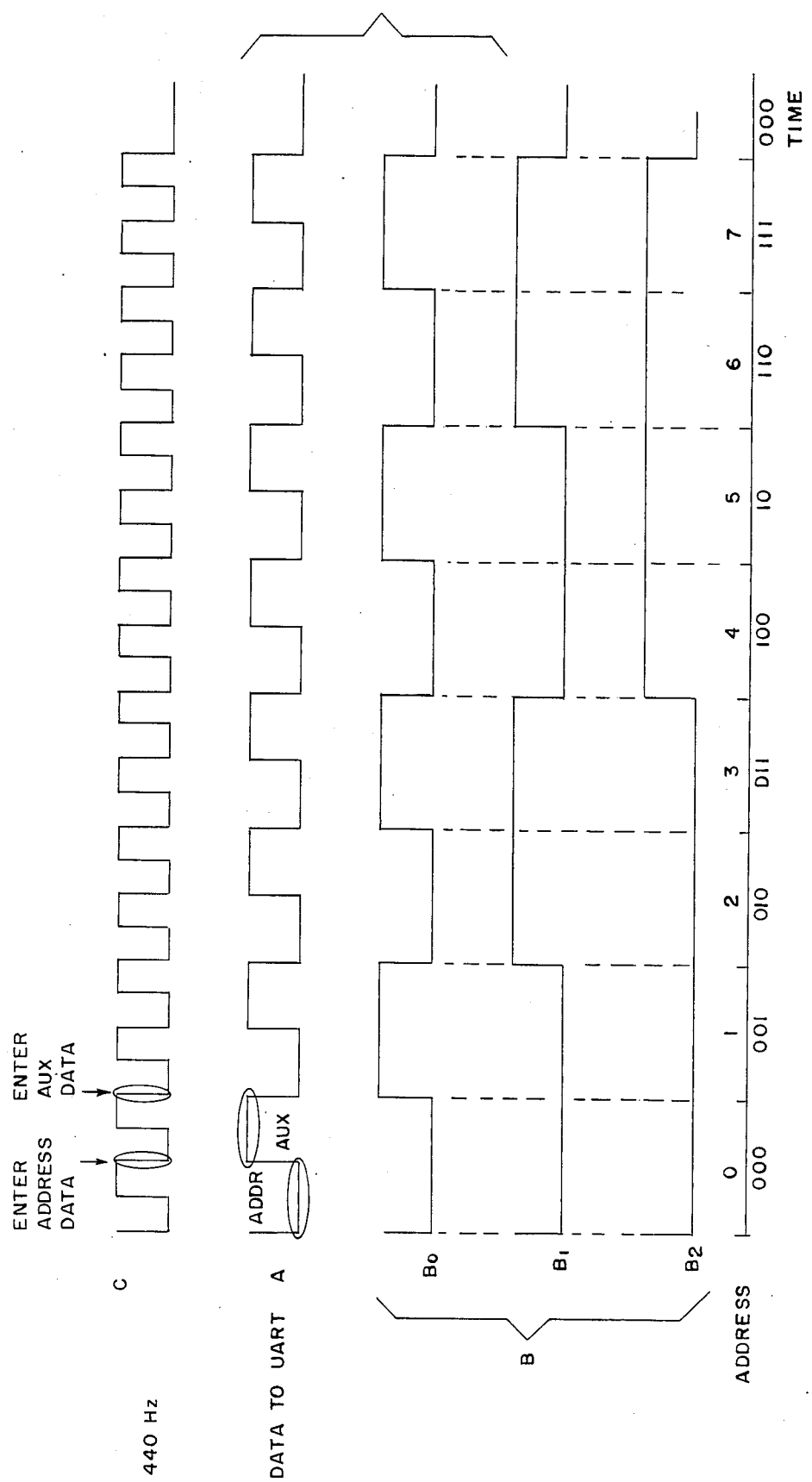
FIG. 2 is a time chart of the most important signals generated by the transmitter portion.

Counting output composite signal B (including weighted signals $B_0$, $B_1$ and $B_2$) is connected to line selecting decoder and driver circuit 60, thereby providing a unique address code that determines any particular address location from 1 to $2^n$ where n is the number of lines composing signal B. In the present illustrative example, n equals 3. Driver circuit 60 decodes signal B and selects one of $2^n$ lines that are connected to $2^n$ telecommunication pairs being identified. $B_0$ being the least significant output component of composite signal B, has a frequency twice as fast as $B_1$ and four times as fast as $B_2$ so that a binary coded decimal information is continuously presented to the input of driver circuit 60. Therefore, the pairs are continuously and sequentially selected in a predetermined order by counting signal B, as shown in the time chart of FIG. 2. Simultaneously, composite signal B is sent to multiplexer or alternating selector circuit 50 on one set of inputs corresponding in number to the number of signal components of signal B. A group selector switch circuit 40 has an equal number of outputs connected to a second set of inputs in multiplexer circuit 50. Selector switch circuit 40 may be implemented by the use of a thumbwheel switch with a coded output, preferably binary coded. A user will be able to select one of a number of groups, in the preferred embodiment being described, the number of groups is eight because only three outputs are used. The purpose for this is that a transmitter with capacity of addressing $2^n$ pairs may further differentiate additional groups of $2^n$ pairs by adding the group number or code introduced by switch circuit 40. The maximum number of groups will be $2^p$ where p is the number of output lines from switch circuit 40. Multiplexer unit 50 then assembles the address information and the group information so that the total capacity of assigning a unique coded representation to each pair increases to $2^{n+p}$.

Multiplexer circuit 50 then, takes the address information from signal B 220 times per second, alternating it with the group number information from switch circuit 40. Output A controls the rate of alternating sampling of the address and group information and output A is twice as fast as $B_0$, which is the fastest (least significant) signal component of B. The data output of multiplexer circuit 50 transmits the alternating address and group information to UART circuit 80. UART stands for universal asynchronous receiver transmitter and circuit 80 may be implemented with General Instrument's catalog No. AY-3-1015D. These two sets of information are assembled one after the other providing a serial combined output by UART circuit 80. UART circuit 80 is controlled by output signals C and D. The output of UART circuit 80 provides the address and group information in serial form. Additionally, start and stop signals at the beginning and end, respectively, of the string of pulses serially conveying this address and group information are provided so that the sequentially selected driver will be able to synchronize in order to extract the address and group information being transmitted. In operation, a particular pair, for example No. 3, will receive a start signal, a serial binary coded pulse string (corresponding to a No. 3 in binary code) followed by a binary coded pulse string representing the assigned group number and, finally, a stop signal. This information will be received, decoded and displayed to the user by the receiver as it is discussed in detail below.

Figure 3:
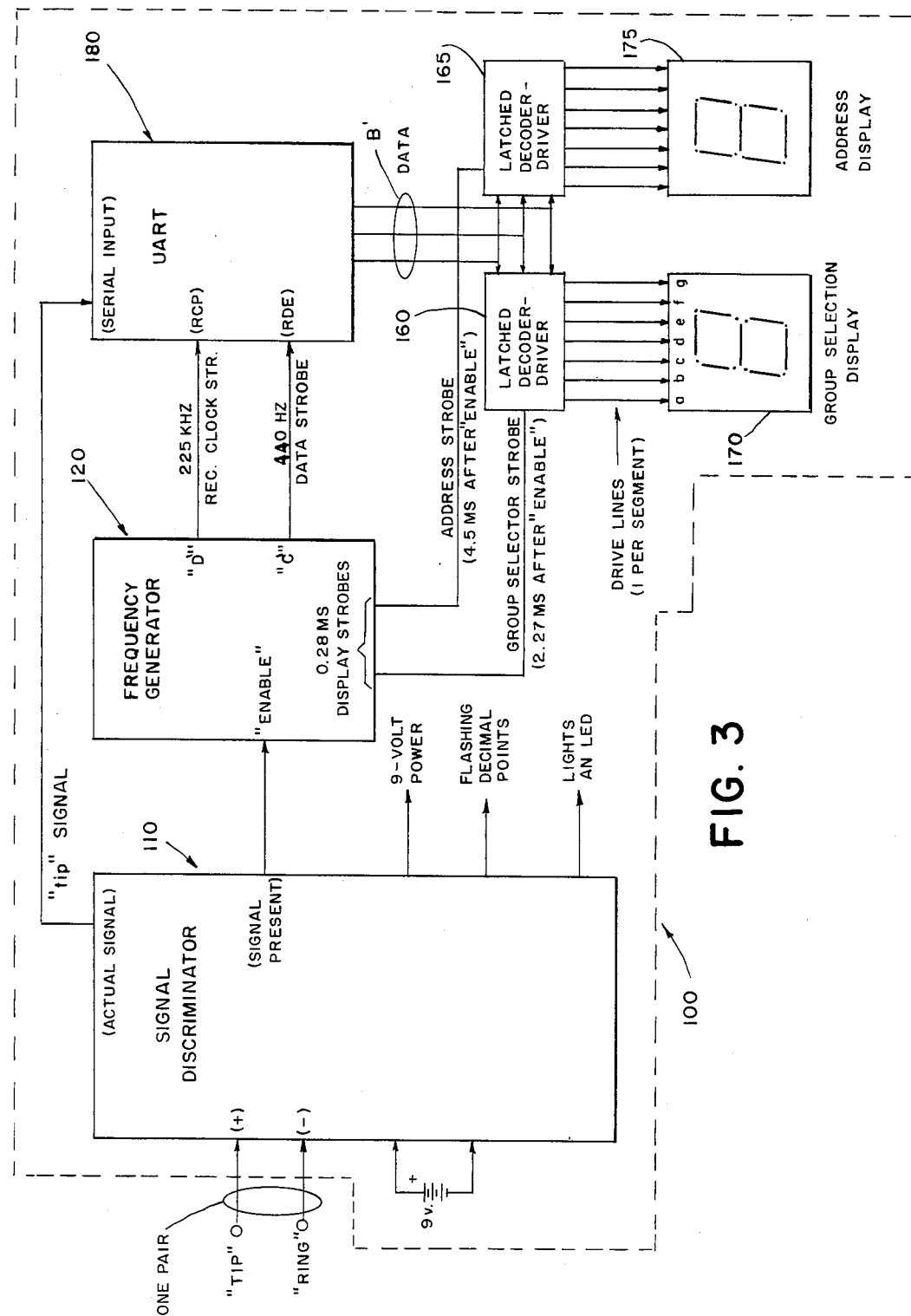
FIG. 3 shows a schematic block diagram of a simplified version of the receiver portion of the present invention.

The receiver 100 represented in FIG. 3 shows one telecommunication pair (tip and ring lines) connected to signal discriminator circuit 110 on its two inputs. Circuit 110 is implemented with an integrated circuit (CMOS) 4049 manufactured by Motorola, Inc. which provides signal and polarity sensing function. If a signal is present, the 9 volt battery power is supplied to the rest of the receiver circuitry provided that it has the correct polarity and does not exceed a certain maximum voltage. Circuit 110 has two output ports: one of them provides the "enable" signal that triggers the "address" and "group" selector strobes in frequency generator circuitry 120 and the other output is connected to the serial input of receiver UART circuit 180.

Frequency generator 120 sends the "group" selector strobe 2.27 milliseconds after the "enable" signal and sends the "address" selector strobe 4.5 milliseconds after the "enable" signal. These strobe signals are fed to group latched decoder/drivers 160 and 165 which in turn are connected to digital displays 170 and 175, respectively. Latched decoder/driver devices 160 and 165 are implemented with CMOS integrated circuits 4511 manufactured by Motorola, Inc., among other manufacturers, and this is a well known application for this I.C. The output from receiver UART circuit 180 is fed to the parallel inputs of devices 160 and 165. The timing of the "address" and "group" strobe signals causes devices 160 and 165 to either accept or ignore the signal presented at their inputs thereby making display device 170 to display the "group" decoded signal and 175 displays the "address" decoded signal.

The serial input of UART circuit 180 receives the signal which includes start and stop bits, address and group information and converts it into a parallel weighted output B' (including $B_0'$, $B_1'$ and $B_2'$). B is the receiver counterpart of B in the transmitter portion. Similarly, receiver UART circuit 180 is provided with a 225 KHz receiver clock strobe signal "D'" and a 440 Hz data strobe signal "C'". Receiver UART circuit 180 may be implemented with the same Radio Shack part mentioned above.

The flashing decimal point of circuit 110 is used to denote a reverse polarity thereby alerting a user of this condition.

It is believed the foregoing description conveys the best understanding of the objects and advantages of the present invention. Different embodiments may be made of the inventive concept of this invention. It is to be understood that all matter disclosed herein is to be interpreted merely as illustrative, and not in a limiting sense, except as set forth in the following appended claims.

What is claimed is:

1. A transmitter and receiver combination device for identifying a particular telecommunication circuit pair in a plurality of circuit pairs having each receiving and transmitting ends, comprising:
   A. counting means for sequentially and continuously generating a predetermined parallel coded output signal;
   B. means for selecting said circuit pairs connected to said means for counting so that each one of said pairs is selected sequentially and continuously according to the output of said counting means;
   C. means for converting said parallel coded output of said counting means to a serial coded output and adapted to send said serial output to said transmitting end of the circuit pair being selected during the time of selection through said means for selecting and said means for converting further including a universal asynchronous receiving and transmitting device having a parallel input port and a serial output port;
   D. means for removably connecting to each one of said receiving ends of said circuit pairs and including means for detecting the output of said counting means being continuously sent;
   E. means for decoding and displaying said detected output so that a particular circuit pair is identified according to said predetermined coded output signal;
   F. means for generating a second parallel coded output and multiplexer means for alternating said first and second parallel coded outputs and connected to said universal asynchronous receiving and transmitting device.

2. The device set forth in claim 1 wherein said means for generating a second parallel coded output includes a thumbwheel switch.

3. The device set forth in claim 2 wherein said first UART device generates start and stop signals that are injected in said serial output signal so that said means for detecting said output can extract said serial coded output signal.

* * * * *